US012652011B2

(12) United States Patent
Matsunami

(10) Patent No.: US 12,652,011 B2
(45) Date of Patent: Jun. 9, 2026

(54) PHYSICAL QUANTITY OUTPUTTING CIRCUIT

(71) Applicant: FUJI ELECTRIC CO., LTD., Kanagawa (JP)

(72) Inventor: Kazuhiro Matsunami, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 483 days.

(21) Appl. No.: 18/453,316

(22) Filed: Aug. 22, 2023

(65) Prior Publication Data

US 2024/0136988 A1    Apr. 25, 2024
US 2024/0235503 A9    Jul. 11, 2024

(30) Foreign Application Priority Data

Oct. 19, 2022    (JP) ................................. 2022-167922

(51) Int. Cl.
*H03F 1/30*        (2006.01)
*H03F 3/45*        (2006.01)

(52) U.S. Cl.
CPC ......... *H03F 3/45475* (2013.01); *H03F 1/303* (2013.01); *H03F 2200/261* (2013.01)

(58) Field of Classification Search
CPC ..................................... H03F 1/30; H03F 3/45
USPC .................................................. 330/297, 252
See application file for complete search history.

(56) References Cited

U.S. PATENT DOCUMENTS

2003/0197513 A1    10/2003    Uematsu

FOREIGN PATENT DOCUMENTS

JP            2003304633 A        10/2003

*Primary Examiner* — Henry Choe

(57)                ABSTRACT

Provided is a physical quantity outputting circuit including a first output terminal, a power supply terminal to which an external power supply voltage is input, a reference terminal to which a reference voltage is input, a power supply voltage circuit which generates an internal power supply voltage from the external power supply voltage, a first output amplifier to which a first input signal corresponding to the physical quantity sensing result is input and which outputs the first output voltage corresponding to the first input signal to the first output terminal, a first resistor connected between the power supply terminal and the first output terminal, and a second resistor connected between the first output terminal and the reference terminal. In the physical quantity outputting circuit, current that flows from the power supply voltage circuit to the first output amplifier has a constant value.

11 Claims, 8 Drawing Sheets

PHYSICAL QUANTITY OUTPUTTING CIRCUIT

The contents of the following patent application(s) are incorporated herein by reference: NO. 2022-167922 filed in JP on Oct. 19, 2022

BACKGROUND

1. Technical Field

The present invention relates to a physical quantity outputting circuit.

2. Related Art

Conventionally, there is known a circuit configuration for sensing abnormal connection between an output terminal of a physical quantity outputting circuit and an external apparatus (for example, refer to Patent Document 1).

PRIOR ART DOCUMENT

Patent Document

Patent Document 1: Japanese Patent Application Publication No. 2003-304633

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solving means of the invention.

Figure 1A:
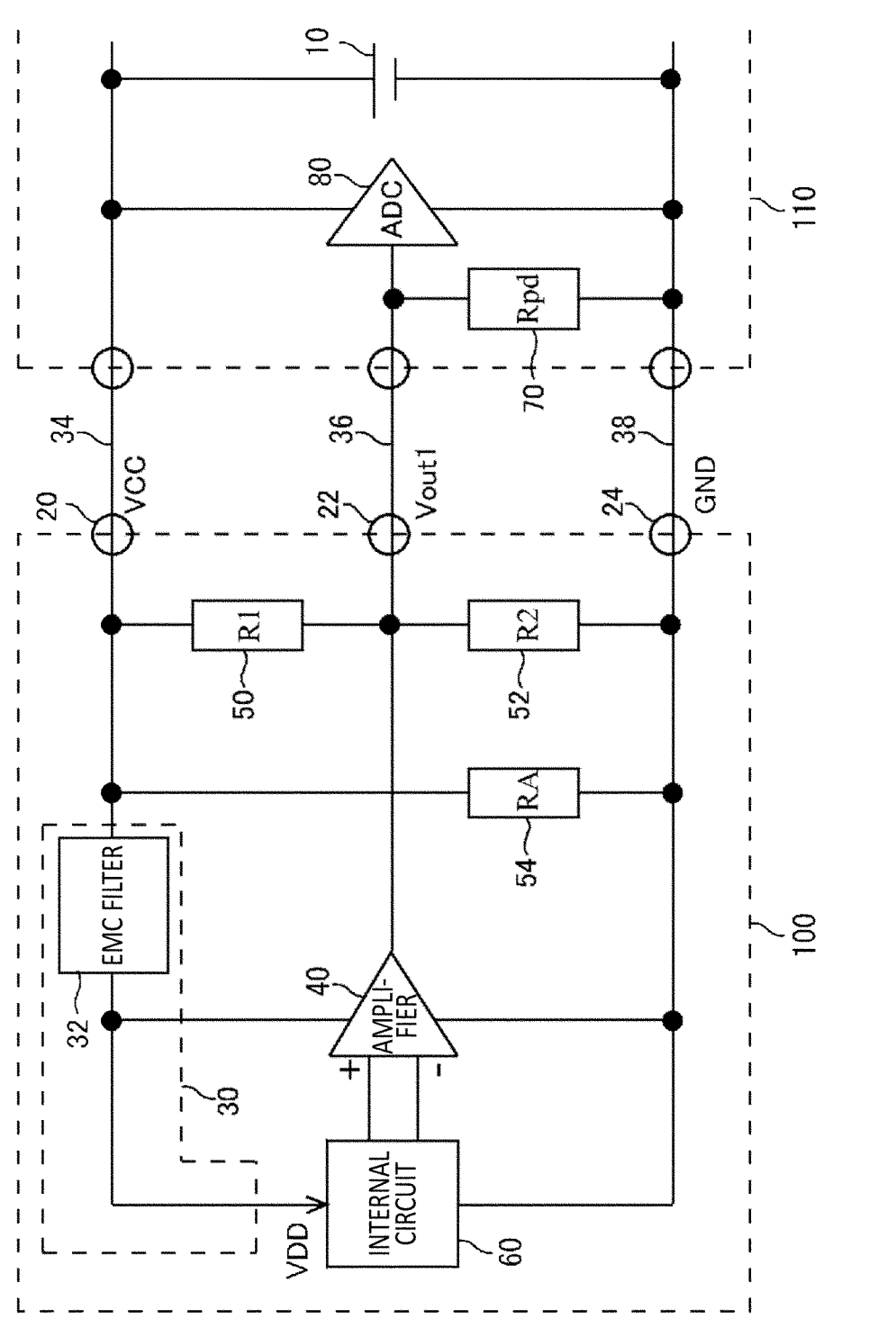
FIG. 1A illustrates a configuration of a physical quantity outputting circuit 100 having a failure sensing function and an example of connection with an engine controlling unit 110.

FIG. 1A illustrates a configuration of a physical quantity outputting circuit 100 having a failure sensing function. By way of example, the physical quantity outputting circuit 100 of the present example outputs a signal corresponding to a sensing result of a physical quantity in a physical quantity sensor such as a pressure sensor, an acceleration sensor, or the like. The physical quantity outputting circuit 100 may have a built-in physical quantity sensor, or may receive a detection result from an external physical quantity sensor. The physical quantity outputting circuit 100 outputs a signal to an external circuit such as an engine controlling unit 110 (hereinafter, ECU). FIG. 1A illustrates an example of connection between the physical quantity outputting circuit 100 and the ECU 110. The physical quantity outputting circuit 100 of the present example outputs a first output voltage (Vout1) corresponding to the physical quantity sensing result.

The physical quantity outputting circuit 100 of the present example includes a power supply terminal 20, a first output terminal 22, a reference terminal 24, a power supply voltage circuit 30, a first output amplifier 40, a first resistor 50, a second resistor 52, an auxiliary resistor 54, and an internal circuit 60. Further, the ECU 110 of the present example includes a power supply 10, a pull-down resistor 70, and an A/D converter 80.

The power supply terminal 20, the first output terminal 22, and the reference terminal 24 of the physical quantity outputting circuit 100 are connected to terminals of the ECU 110. An external power supply voltage (VCC) from the power supply 10 of the ECU 110 is input in the power supply terminal 20. A reference voltage is input in the reference terminal 24. The reference voltage may be a ground potential (GND).

The power supply voltage circuit 30 generates an internal power supply voltage (VDD) from the external power supply voltage (VCC). The internal power supply voltage (VDD) may follow fluctuation of the external power supply voltage (VCC). The term "follow" refers to a fact that, when the external power supply voltage (VCC) fluctuates, the internal power supply voltage (VDD) takes a value corresponding to the fluctuation. By way of example, the power supply voltage circuit 30 has a series resistor connected in series between a node to which the external power supply voltage (VCC) is applied and a node to which the internal power supply voltage (VDD) is applied. The internal power supply voltage (VDD) of the present example is a voltage that has become lower than the external power supply voltage (VCC) in response to a voltage drop in the series resistor.

The power supply voltage circuit 30 of the present example includes an EMC filter 32 which has a function of removing noise superimposed on the power supply terminal 20 to stabilize the internal power supply voltage (VDD). The EMC filter 32 may have the series resistor described above. For the series resistor of the EMC filter 32, resistance of polysilicon etc. or ON resistance of a device such as a MOSFET is used. Therefore, in a case of the present example, the internal power supply voltage (VDD) takes a value obtained through a voltage drop caused in the series resistor of the EMC filter 32, which is dropped from a value of the external power supply voltage (VCC). The power supply voltage circuit 30 may not include the EMC filter 32.

The power supply voltage circuit 30 inputs the generated internal power supply voltage (VDD) in the internal circuit 60 and the first output amplifier 40. The reference terminal 24 inputs a reference voltage in the internal circuit 60 and the first output amplifier 40. The internal circuit 60 of the present example includes a physical quantity sensor which senses a physical quantity. The internal circuit 60 outputs a first input signal corresponding to a physical quantity sensing result to the first output amplifier 40.

The first output amplifier 40 is connected to the power supply voltage circuit 30 and applied with the internal power supply voltage (VDD), and connected to the reference terminal and applied with the reference voltage. The first input signal corresponding to the physical quantity sensing result is input in the first output amplifier 40, and then the first output amplifier 40 outputs the first output voltage (Vout1) corresponding to the first input signal to the first output terminal 22. By way of example, the first input signal is a signal having a voltage corresponding to a magnitude of the sensed physical quantity. The first output amplifier 40 may output a first output voltage (Vout1) obtained by amplifying a voltage of the first input signal to the first output terminal 22. The first output terminal outputs the first output voltage (Vout1) to the ECU 110.

The first resistor 50 is connected between the power supply terminal 20 and the first output terminal 22. The second resistor 52 is connected between the first output terminal 22 and the reference terminal 24. The auxiliary resistor 54 is connected between the power supply terminal 20 and the reference terminal 24. By providing these resistors, abnormal connection between the physical quantity outputting circuit 100 and the ECU 110 can be detected. A mechanism for detecting the abnormal connection will be explained in FIGS. 1B and 1C.

The pull-down resistor 70 of the ECU 110 is connected between a connection line 36 of the first output terminal 22 and a connection line 38 of the reference terminal 24. Instead of the pull-down resistor 70, the ECU 110 may include a pull-up resistor 72 (refer to FIG. 1C) connected between a connection line 34 of the power supply terminal 20 and the connection line 36 of the first output terminal 22.

The A/D converter 80 of the ECU 110 is connected between the connection line 34 of the power supply terminal 20 and the connection line 38 of the reference terminal 24, and converts a first output voltage (Vout1) input from the first output terminal 22 in a digital signal. A value of this digital signal indicates the sensed physical quantity. The ECU 110 may control an apparatus such as an engine, based on the digital signal output by the A/D converter 80.

Figure 1B:
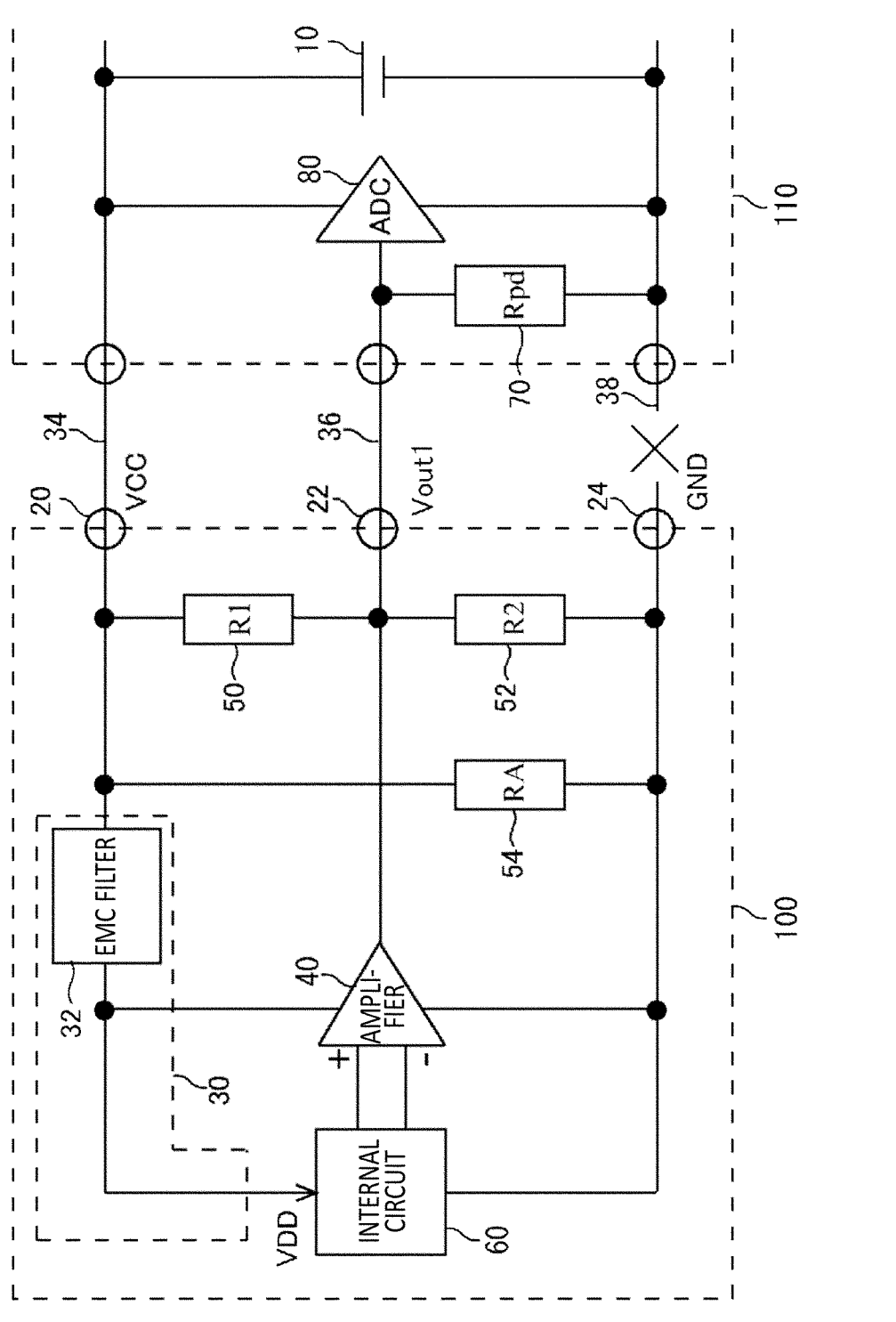
FIG. 1B is a diagram for explaining, in a configuration in which the ECU 110 includes a pull-down resistor 70, a first output voltage when a connection line of a reference terminal 24 is disconnected.

FIG. 1B is a diagram for explaining, in a configuration in which the ECU 110 includes the pull-down resistor 70, a first output voltage (Vout1) when the connection line 38 of the reference terminal 24 is disconnected. When the connection line 38 of the reference terminal 24 is disconnected, the first output voltage (Vout1) becomes a voltage obtained by dividing the external power supply voltage (VCC) by the pull-down resistor 70 of the ECU 110, and a combined resistor between the power supply terminal 20 and the first output terminal 22 of the physical quantity outputting circuit 100. To ensure that the first output voltage (Vout1) determined by this dividing becomes a voltage near the power supply voltage outside a normal output range, a resistance value of each resistor of the physical quantity outputting circuit 100 is set to a value sufficiently small relative to a resistance value (Rpd) of the 70 pull-down resistor.

Here, the normal output range refers to a range of a voltage that the first output voltage (Vout1) can take, in a normal state with no disconnection occurring. Although unillustrated, when the connection line 34 of the power supply terminal 20 is disconnected, the first output voltage (Vout1) becomes a voltage near the reference voltage by virtue of the pull-down resistor 70. In either of these cases, abnormal connection can be sensed through the first output voltage (Vout1) becoming a value outside the normal output range.

Figure 1C:
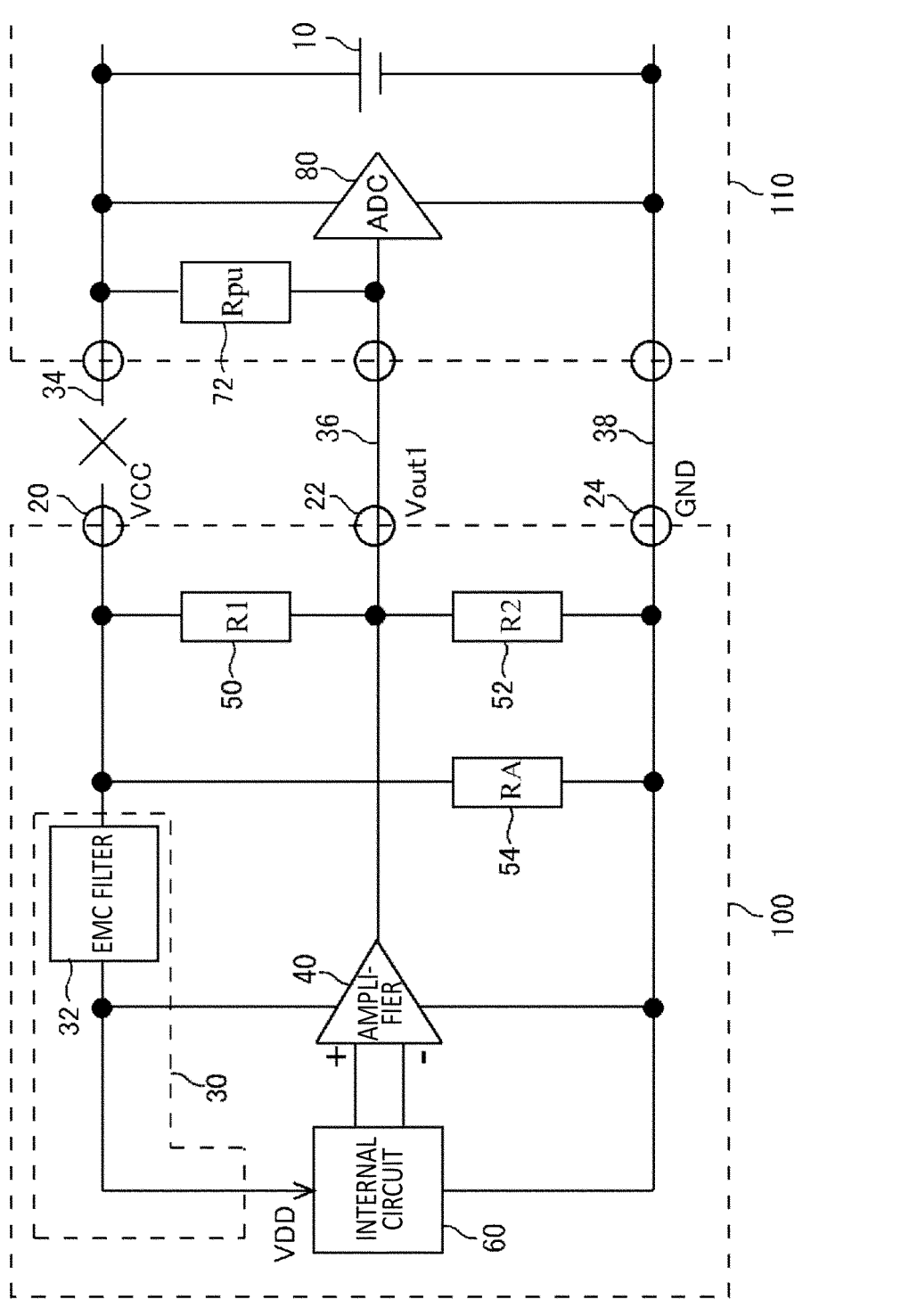
FIG. 1C is a diagram for explaining, in a configuration in which the ECU 110 includes a pull-up resistor 72, a first output voltage when a connection line of a power supply terminal 20 is disconnected.

FIG. 1C is a diagram for explaining, in a configuration in which the ECU 110 includes the pull-up resistor 72, a first output voltage (Vout1) when the connection line 34 of the power supply terminal 20 is disconnected. When the connection line 34 of the power supply terminal 20 is disconnected, the first output voltage (Vout1) becomes a voltage obtained by dividing the external power supply voltage (VCC) by the pull-up resistor 72, and a combined resistor between the first output terminal 22 and the reference terminal 24 of the physical quantity outputting circuit 100. To ensure that the first output voltage (Vout1) determined by this dividing becomes a voltage near a ground voltage outside a normal output range, a resistance value of each resistor of the physical quantity outputting circuit 100 is set to a value sufficiently small relative to a resistance value (Rpu) of the pull-up resistor 72.

Although unillustrated, when the connection line 38 of the reference terminal 24 is disconnected, the first output voltage (Vout1) becomes a voltage near the power supply voltage by virtue of the pull-up resistor 72. In either of these cases, abnormal connection can be sensed through the first output voltage (Vout1) becoming a value outside the normal output range.

From FIG. 1A to FIG. 1C and in the following diagrams, the physical quantity outputting circuit 100 includes the auxiliary resistor 54 between the power supply terminal 20 and the reference terminal 24. By including the auxiliary resistor 54, current consumption between the power supply terminal 20 and the reference terminal 24 increases. On the other hand, a resistance value between terminals between the power supply terminal 20 and the first output terminal 22 becomes a parallel combined resistance value of the first resistor 50, and a series resistor of the second resistor 52 and the auxiliary resistor 54. In addition, a resistance value between terminals between the first output voltage (Vout1) and the reference terminal 24 is not simply the second resistor 52 but a parallel combined resistance value of the second resistor 52, and a series resistor of the first resistor 50 and the auxiliary resistor 54. In this manner, a resistance value between the terminals becomes small in failure sensing. Therefore, compared to a case in which the auxiliary resistor 54 is not added, the resistance value (R1) of the first resistor 50 and the resistance value (R2) of the second resistor 52 during normal operation when the first output amplifier 40 is driving can be larger, and driving capability of the first output amplifier 40 can be smaller.

However, a resistance value (RA) of the auxiliary resistor 54 does not contribute to the effect of the embodiment described below, and the same effect can be obtained even if the auxiliary resistor 54 is not provided. Therefore, operations and effects are described using the configuration including the auxiliary resistor 54 as an embodiment, but the embodiment also includes a case in which no auxiliary resistor 54 is included.

Figure 2A:
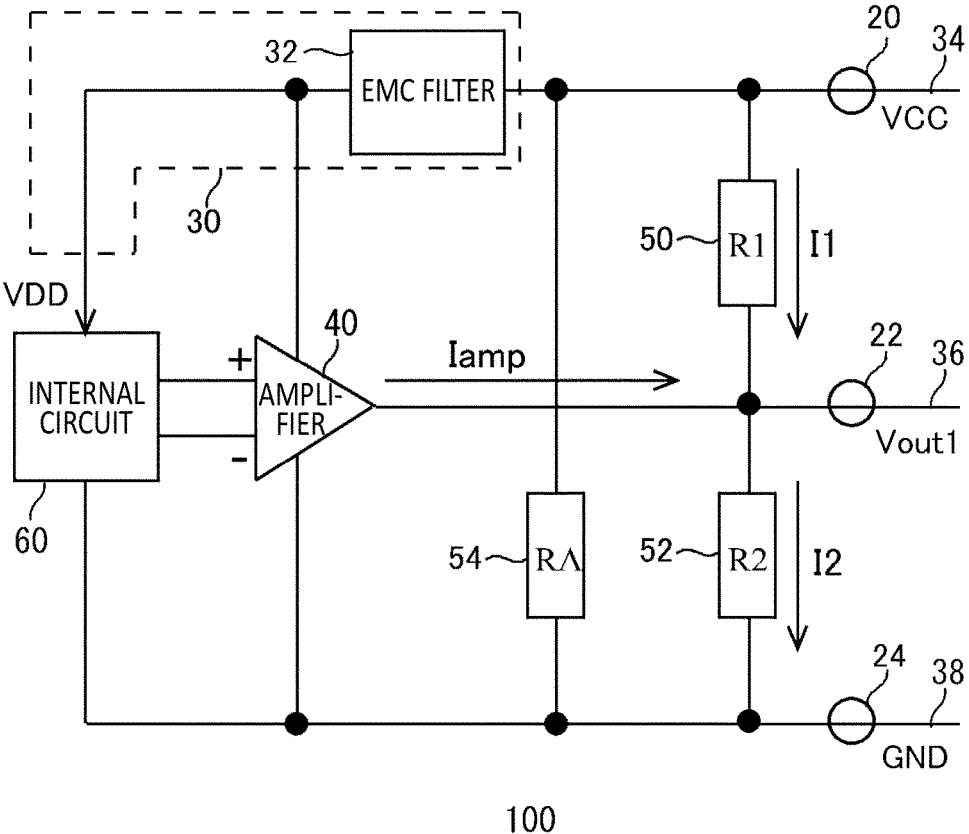
FIG. 2A illustrates change in current I1 that flows in a first resistor 50 and current I2 that flows in a second resistor 52 in the physical quantity outputting circuit 100 illustrated in FIG. 1.

FIG. 2A illustrates change in current I1 that flows in the first resistor 50 and current I2 that flows in the second resistor 52 in the physical quantity outputting circuit 100 illustrated in FIG. 1A. Because the current I1 is a value obtained by dividing a voltage between the power supply terminal 20 and the first output terminal 22 by a resistance value (R1) of the first resistor 50, it is expressed by the following equation.

$$I1=(VCC-Vout1)/R1$$

Because the current I2 is a value obtained by dividing a voltage between the first output terminal 22 and the reference terminal 24 by a resistance value (R2) of the second resistor 52, it is expressed by the following equation.

$$I2=(Vout1-GND)/R2$$

Since both of the equations expressing the currents include the first output voltage (Vout1), if the first output voltage (Vout1) changes, both of the current I1 and the current I2 change.

If there is a difference between the current I1 and the current I2, the current difference will be covered by the current Iamp output from the first output amplifier 40. In that case, it is expressed by the following equation.

$$Iamp=I2-I1$$

If the current Iamp is a positive value, current (that is, source current) flows from the power supply terminal 20 toward the second resistor 52 through the power supply voltage circuit 30 and the first output amplifier 40, and if the Iamp is a negative value, current (that is, sink current) flows from the first resistor 50 toward the reference terminal 24 through the first output amplifier 40.

Figure 2B:
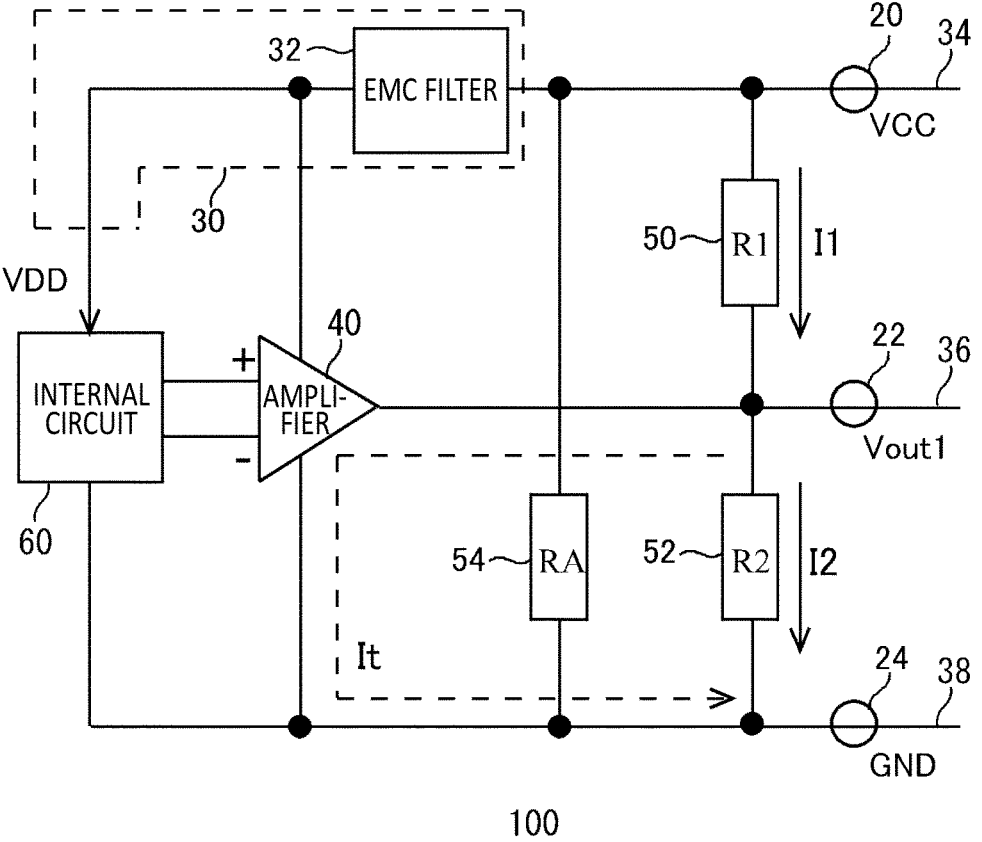
FIG. 2B illustrates current consumption in the physical quantity outputting circuit 100 when I1>I2.

FIG. 2B illustrates current consumption in the physical quantity outputting circuit 100 when I1>I2. Since a value of the current I1 is greater than a value of the current I2, the current Iamp becomes a negative value and thus a sink current I1 flows in the first output amplifier 40.

As described above, since the current I1 changes depending on the first output voltage (Vout1), if the first output voltage (Vout1) changes, current supplied from the ECU 110 to the power supply terminal 20 changes. However, because no source current flows in the first output amplifier 40, current supplied from the power supply terminal 20 to the first output amplifier 40 through the power supply voltage circuit 30 does not change, so that the internal power supply voltage (VDD) does not change.

Figure 2C:
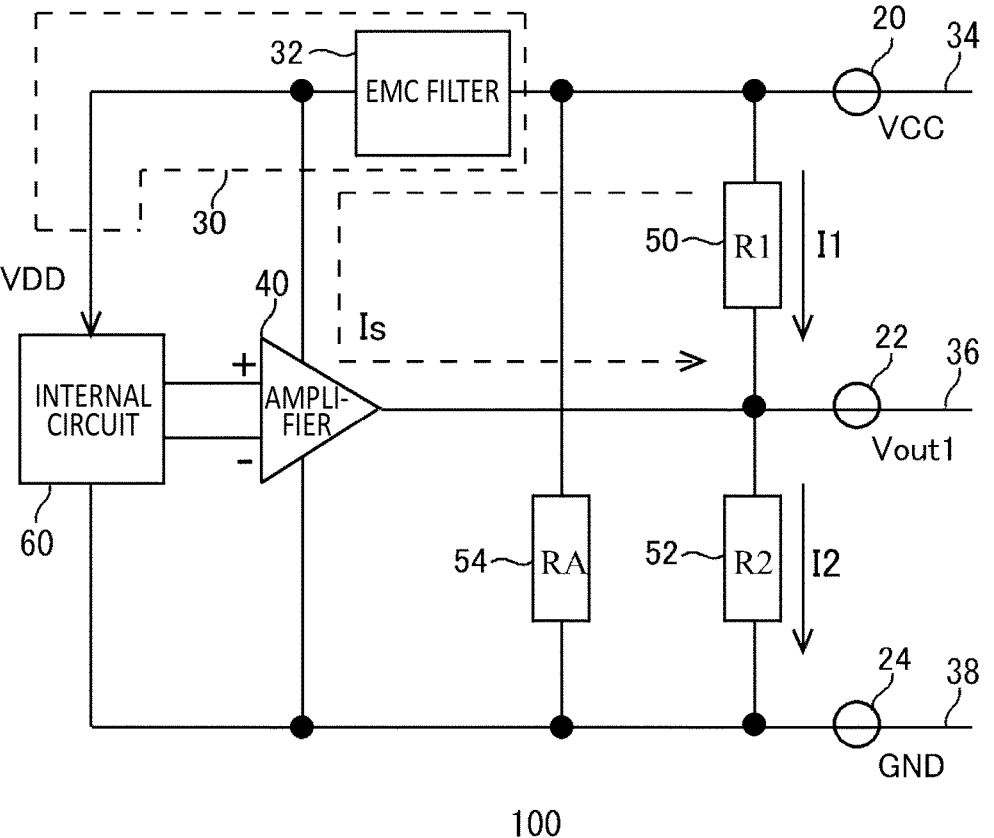
FIG. 2C illustrates current consumption in the physical quantity outputting circuit 100 when I1≤I2.

FIG. 2C illustrates current consumption in the physical quantity outputting circuit 100 when I1≤I2. Since a value of the current I1 is a value of the current I2 or less, the current Iamp becomes a positive value and thus a source current Is flows in the first output amplifier 40.

As described above, since the current I2 changes depending on the first output voltage (Vout1), if the first output voltage (Vout1) changes, current supplied from the ECU 110 to the power supply terminal 20 changes. In addition, it is necessary to cover the shortfall of current I1 relative to current I2 with a source current. Therefore, current that flows from the power supply terminal 20 to the first output amplifier 40 through the power supply voltage circuit 30 changes, and the internal power supply voltage (VDD) changes depending on the change in a voltage drop amount in a series resistor of the power supply voltage circuit 30.

A physical quantity outputting circuit 200 in a first embodiment of the present invention has an abnormal connection sensing function, and in the physical quantity outputting circuit 200, an internal power supply voltage (VDD) output by a power supply voltage circuit 30 does not change in response to fluctuation of a first output voltage (Vout1). That is, if an external power supply voltage (VCC) is in a steady state, current that flows from the power supply voltage circuit 30 to a first output amplifier 40 has a constant value regardless of the fluctuation of the first output voltage (Vout1). By way of example, if the external power supply voltage (VCC) is in a steady state, current that flows from the first output amplifier 40 to a second resistor 52 becomes 0 A regardless of fluctuation of the first output voltage (Vout1).

Here, the external power supply voltage (VCC) being in the steady state may refer to a fact that fluctuation of the external power supply voltage (VCC) in a predetermined period of time is within a predetermined range. The predetermined period of time may be a period of time of 0.5 seconds or more, 1 second or more, or 2 seconds or more. The predetermined range may be a range of equal to or within ±10%, equal to or within ±6%, equal to or within ±5%, or equal to or within ±1% relative to an average voltage in this predetermined period of time.

The current having a constant value means that fluctuation in a small range is allowed. This small range may be equal to or within ±5%, equal to or within ±1%, equal to or within ±0.5%, or equal to or within ±0.1% relative to an average of current values in a period of time in which the external power supply voltage (VCC) is in a steady state. The current being 0 A refers to a fact that the current is substantially 0 A. Substantially 0 A may refer to a fact that an absolute value of the current is 0.1 mA or less, 0.05 mA or less, or 0.01 mA or less.

Figure 3:
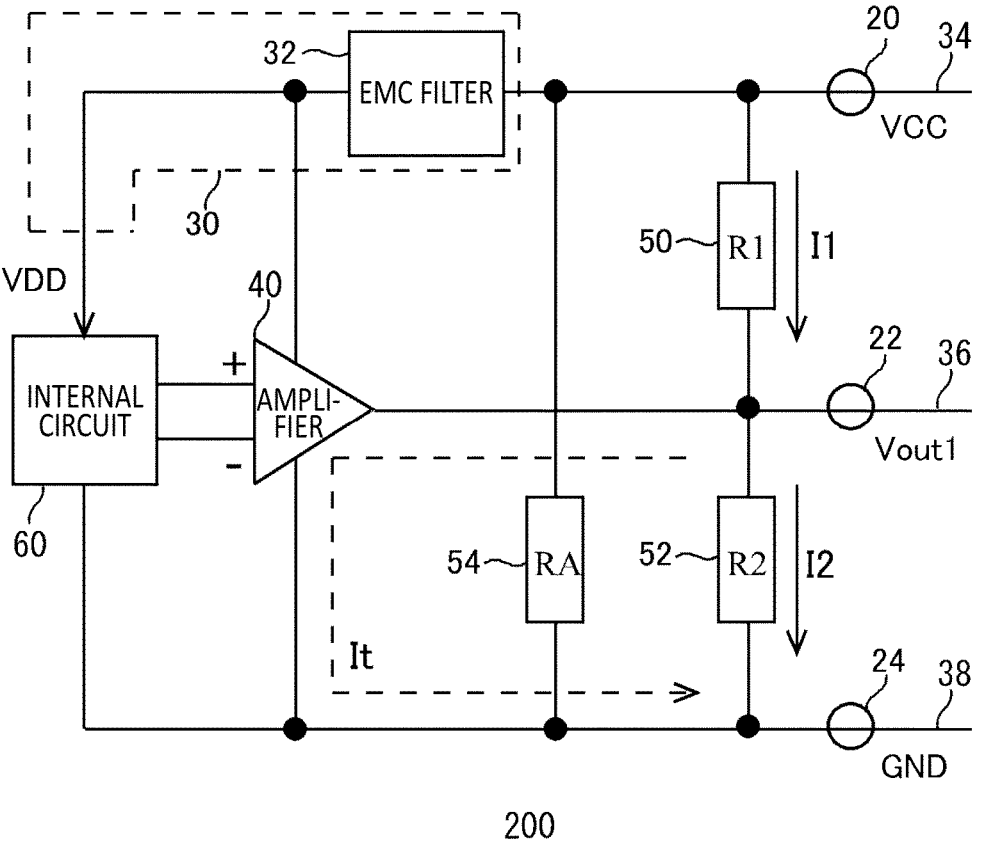
FIG. 3 is a diagram for explaining a physical quantity outputting circuit 200 in a first embodiment.

FIG. 3 is a diagram for explaining the physical quantity outputting circuit 200 in the first embodiment. Application and configuration of the physical quantity outputting circuit 200 is the same as those of the physical quantity outputting circuit 100 explained in FIG. 1A. In the present embodiment also, the physical quantity outputting circuit 200 is connected to an ECU 110 by way of example. The physical quantity outputting circuit 200 has a resistance value (R1) of a first resistor 50 and a resistance value (R2) of a second resistor 52 different from those of the physical quantity outputting circuit 100 in FIG. 1A.

In FIG. 3, as described above, a current I1 that flows in the first resistor 50 changes depending on the fluctuation of the first output voltage (Vout1). If the first output voltage (Vout1) is a first output upper limit voltage, the current I1 becomes a minimum value. The first output upper limit voltage has an upper limit value of the first output voltage (Vout1). If the current I1 is greater than a current I2 that flows in the second resistor 52 when the first output voltage (Vout1) is at the first output upper limit voltage, no source current flows even if the first output voltage (Vout1) fluctuates in an output range.

A relation between the first resistor 50 and the second resistor 52 that satisfies the above requirement can be obtained by solving the equations for the current I1 and the current I2 described above with a condition of I1>I2, in a case in which the first output voltage (Vout1) is the first output upper limit voltage. That is, the above requirement is satisfied when a resistance value ratio (R1/R2), which is obtained by dividing the resistance value (R1) of the first resistor 50 by the resistance value (R2) of the second resistor 52, is equal to or less than a voltage ratio obtained by dividing a potential difference between the external power supply voltage (VCC) and the first output upper limit voltage that is the upper limit value of the first output voltage (Vout1) by the first output upper limit voltage, i.e., ((external power supply voltage−first output upper limit voltage)/first output upper limit voltage).

For example, when the external power supply voltage (VCC) is 5 V, and the first output upper limit voltage is 4.5 V, the resistance value ratio that satisfies the above requirement is 1/9 or less. In this manner, the physical quantity outputting circuit 200 which has the abnormal connection sensing function for the connection between the physical quantity outputting circuit 200 and the ECU 110, prevents fluctuation of the internal power supply voltage (VDD), and has high linearity of the first output voltage (Vout1) can be manufactured.

Here, the first output upper limit voltage is a specification value defined in a specification document or the like. If a range of the first output voltage (Vout1) is limited by a circuit configuration of a clamp circuit etc., the first output upper limit voltage may be a limited value set by the circuit configuration of the clamp voltage etc. The first output upper limit voltage may be in such a range by which linearity of the first output voltage (Vout1) can be obtained. The first output upper limit voltage may be a value of 90% of a power supply voltage, or may be a value of 94%, or 97% of this power supply voltage. The power supply voltage may be an upper limit value of a power supply voltage applied to the power supply terminal 20 that is defined by a specification document or the like, or may be a voltage generated by a power supply 10.

It is possible to make current have a substantially constant value by increasing the resistance value (R1) of the first resistor 50 and the resistance value (R2) of the second resistor 52, and reducing current that flows in each resistor, and thereby reducing an absolute value of a change amount of the current. In this manner, a voltage drop amount in the power supply voltage circuit 30 can be reduced, and fluctuation of the internal power supply voltage (VDD) can be prevented.

If the resistance value (R1) of the first resistor 50 is lowered too much, current consumption of the physical quantity outputting circuit 200 is increased, but if it is raised too much, sensing of abnormal connection will be difficult. As an acceptable range for these impacts, the resistance value (R1) of the first resistor 50 may be 0.5 kΩ or more and 6.0 kΩ or less. The resistance value (R1) of the first resistor 50 may be 2.0 kΩ or more, or 4.0 kΩ or more. The resistance value (R1) of the first resistor 50 may be 4.0 kΩ or less, or 2.0 kΩ or less. An upper limit value and a lower limit value of the resistance value (R1) of the first resistor 50 may be any combination of values.

Similarly, if the resistance value (R2) of the second resistor 52 is lowered too much, current consumption of the physical quantity outputting circuit 200 is increased, but if it is raised too much, sensing of abnormal connection will be difficult. As an acceptable range for these impacts, and as a range that satisfies the above requirement for the resistance value ratio, the resistance value (R2) of the second resistor 52 may be 5 kΩ or more and 60 kΩ or less. The resistance value (R2) of the second resistor 52 may be 10 kΩ or more, or 40 kΩ or more. The resistance value (R2) of the second resistor 52 may be 40 kΩ or less, or 10 kΩ or less. An upper limit value and a lower limit value of the resistance value (R2) of the second resistor 52 may be any combination of values.

As described above, for sensing abnormal connection, the resistance value (R1) of the first resistor 50 and the resistance value (R2) of the second resistor 52 may be set to values sufficiently small relative to the resistance value (Rpd) of the pull-down resistor 70 or the resistance value (Rpu) of the pull-up resistor 72 of the ECU 110. By way of example, the resistance value (Rpd) of the pull-down resistor 70 or the resistance value (Rpu) of the pull-up resistor 72 is 50 kΩ or more and 300 kΩ or less. The resistance value (Rpd) of the pull-down resistor 70 or the resistance value (Rpu) of the pull-up resistor 72 may be 100 times or greater, 200 times or greater, or 500 times or greater than the resistance value (R1) of the first resistor 50. Therefore, current that flows from the first output terminal 22 to the ECU 110 is negligibly small.

By virtue of any of the above configurations, if the external power supply voltage (VCC) is in a steady state, current that flows from the power supply voltage circuit 30 to the first output amplifier 40 can have a constant value regardless of fluctuation of the first output voltage (Vout1). On the other hand, as described above, since the current I1 changes depending on the first output voltage (Vout1), if the first output voltage (Vout1) changes, current supplied from the ECU 110 to the power supply terminal 20 changes. If the current supplied to the power supply terminal 20 changes, a voltage drop amount caused by wiring resistance of the connection line 34 of the power supply terminal 20 changes. Thus, even when the power supply voltage in the ECU 110 does not fluctuate, the external power supply voltage (VCC) applied to the power supply terminal 20 fluctuates, and also the internal power supply voltage (VDD) fluctuates. Therefore, it is desirable that current that is consumed in the physical quantity outputting circuit 200 is constant regardless of the first output voltage (Vout1).

Figure 4:
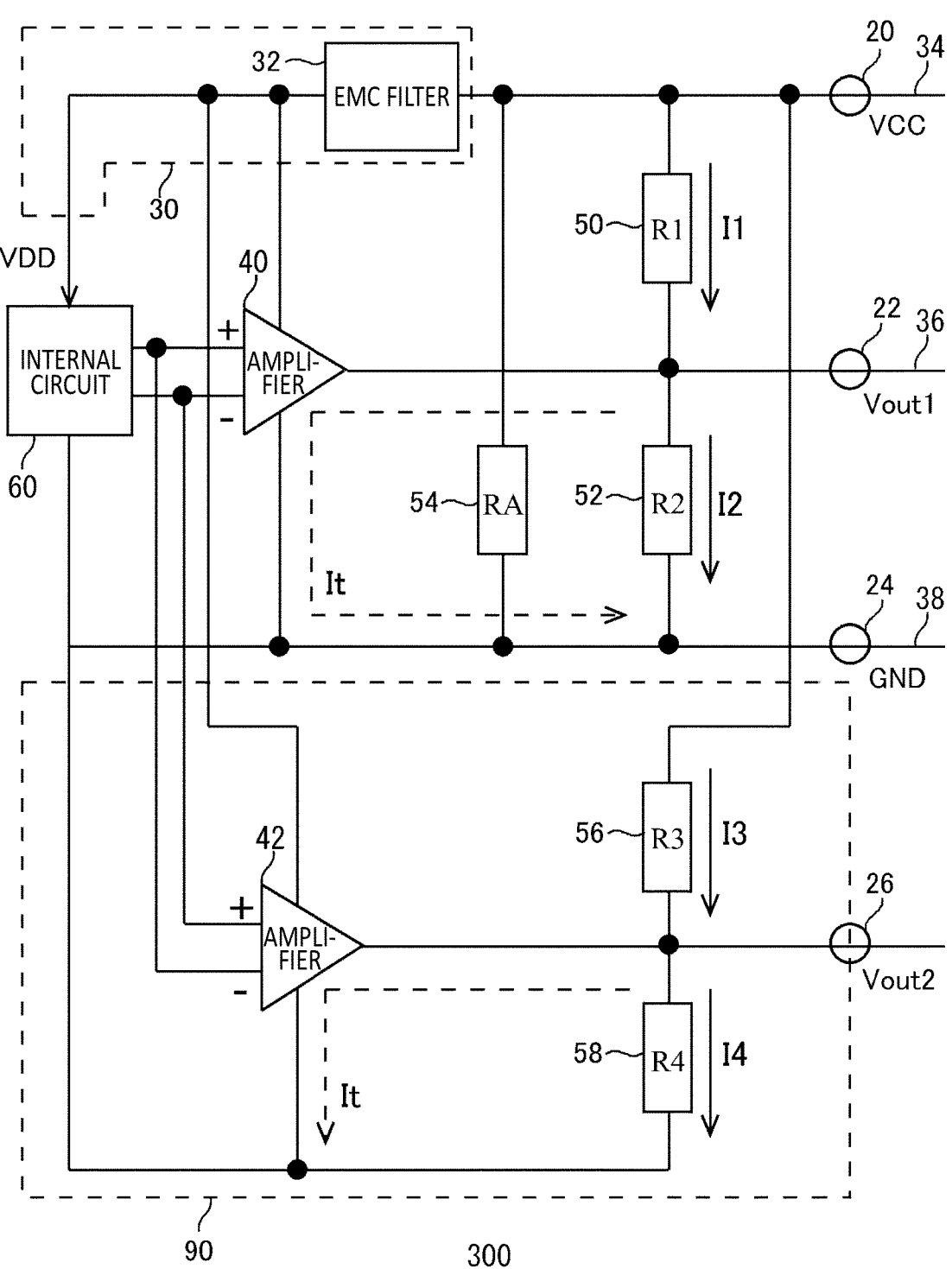
FIG. 4 is a diagram for explaining a physical quantity outputting circuit 300 in a second embodiment.

FIG. 4 is a diagram for explaining a physical quantity outputting circuit 300 in a second embodiment. The physical quantity outputting circuit 300 includes a current consumption adjusting circuit 90 which draws a second current from a power supply terminal 20. Assuming that a first current is a current I1 that flows in a first resistor 50, the current consumption adjusting circuit 90 has a function of drawing the second current depending on fluctuation of the first current, so that the sum of the first current and the second current stays constant. The current staying constant means that fluctuation in a small range is allowed. This small range may be equal to or within ±5%, equal to or within ±1%, equal to or within ±0.5%, or equal to or within ±0.1% relative to an average of current values in a period of time in which an external power supply voltage (VCC) is in a steady state.

The physical quantity outputting circuit 300 includes the current consumption adjusting circuit 90 in addition to the configuration shown in FIG. 3. The current consumption adjusting circuit 90 includes a second output terminal 26, a second output amplifier 42, a third resistor 56, and a fourth resistor 58.

The second output amplifier 42 is connected to the power supply voltage circuit 30 and applied with an internal power supply voltage (VDD), and connected to a reference terminal 24 and applied with a reference voltage. A second input signal corresponding to a physical quantity sensing result is input from an internal circuit 60 to the second output amplifier 42, and then the second output amplifier 42 outputs a second output voltage (Vout2) corresponding to the second input signal to the second output terminal 26. At this time, the second output amplifier 42 outputs the second output voltage (Vout2), such that the sum of the first output voltage (Vout1) and the second output voltage (Vout2) stays constant.

By way of example, operational amplifiers may be used for the first output amplifier 40 and the second output amplifier 42. Also, the first output amplifier 40 and the second output amplifier 42 may have the same configurations. The second output amplifier 42 may be connected to the internal circuit 60 having inverting and non-inverting inputs on its input terminals reversed as compared to the first output amplifier 40. Accordingly, the first input signal is a signal in which one of two signals output from an internal circuit 60 is input to a non-inverting input terminal and another signal is input to an inverting input terminal. The second input signal is a signal in which one of two signals output from an internal circuit 60 is input to an inverting input terminal and another signal is input to a non-inverting input terminal. In this case, the second output amplifier 42 outputs a potential difference between the power supply terminal 20 and the first output terminal 22 as the second output voltage (Vout2). The second output terminal 26 outputs the second output voltage (Vout2) corresponding to the physical quantity sensing result. Note that, the second output terminal 26 may be or may not be connected to an external circuit. The third resistor 56 is connected between the power supply terminal 20 and the second output terminal 26. The fourth resistor 58 is connected between the second output terminal 26 and the reference terminal 24.

Assuming that an I3 is current that flows in the third resistor, and an I4 is current that flows in the fourth resistor, because the current I3 is a value obtained by dividing a potential difference between the power supply terminal 20 and the second output terminal 26 by a resistance value (R3) of the third resistor 56, it is expressed by the following equation.

$$I3 = (VCC - Vout2)/R3$$

Because the current I4 is a value obtained by dividing a potential difference between the second output terminal 26 and the reference terminal 24 by a resistance value (R4) of the fourth resistor 58, it is expressed by the following equation.

$$I4 = (Vout2 - GND)/R4$$

Here, assuming that the resistance value (R1) of the first resistor 50 and the resistance value (R3) of the third resistor 56 are equal, and the resistance value (R2) of the second resistor 52 and the resistance value (R4) of the fourth resistor 58 are equal, by using a condition that a difference between the external power supply voltage (VCC) and the first output voltage (Vout1) is equal to the second output voltage (Vout2), the sum of the current I1 that flows in the first resistor and the current I3 is expressed by the following equation.

$$I1 + I3 = (VCC - Vout1)/R1 + (VCC - Vout2)/R3$$
$$= (VCC - Vout1)/R1 + Vout1/R1$$
$$= VCC/R1$$

This means that it is no longer dependent on the first output voltage (Vout1). Similarly, the sum of the current I2 that flows in the second resistor and the current I4 is expressed by the following equation.

$$I2 + I4 = (Vout1 - GND)/R2 + (Vout2 - GND)/R4$$
$$= (Vout1 - GND)/R2 + (VCC - Vout1 - GND)/R2$$
$$= VCC/R2$$

This means that it is no longer dependent on the first output voltage (Vout1). Note that, the resistance values being equal may mean that an error of equal to or within ±10% is included. At this time, the second current drawn by the current consumption adjusting circuit 90 is the current I3.

In this manner, abnormal connection sensing function for connection between the physical quantity outputting circuit 300 and the ECU 110 can be held, and current consumption of the physical quantity outputting circuit 300 can be made constant regardless of fluctuation of the first output voltage (Vout1). By making the current consumption of the physical quantity outputting circuit 300 constant, the voltage drop amount at the connection line 34 from the ECU 110 to the power supply terminal 20 becomes constant. Therefore, the external power supply voltage (VCC) and the internal power supply voltage (VDD) become constant also, and output linearity of the physical quantity outputting circuit 300 further improves. Also, even if the first output voltage (Vout1) fluctuates, voltage supplied to an A/D converter 80 of the ECU 110 and the external power supply voltage (VCC) can be made equal.

Note that, the current being constant means that fluctuation in a small range is allowed. This small range may be equal to or within ±5%, equal to or within ±1%, equal to or within ±0.5%, or equal to or within ±0.1% relative to an average of current values in a period of time in which the external power supply voltage (VCC) is in a steady state.

If a resistance value ratio between the first resistor 50 and the second resistor 52 satisfies the requirement described above, the resistance value (R1) of the first resistor 50 and the resistance value (R3) of the third resistor 56 are equal, and the resistance value (R2) of the second resistor 52 and the resistance value (R4) of the fourth resistor 58 are equal, then because the current I3 becomes greater than the current I4, no source current flows in the current consumption adjusting circuit 90. However, if a potential difference between the external power supply voltage (VCC) and the first output upper limit voltage is greater than a potential difference between a first output lower limit voltage that is a lower limit value of the first output voltage (Vout1) and the reference voltage, source current may flow depending on relation between each of the resistance values. Therefore, in the first output lower limit voltage in which the current I3 becomes minimum, if the current I3 is greater than the current I4, then no source current flows in the current consumption adjusting circuit 90 even if the first output voltage (Vout1) fluctuates in an output range.

That is, if a resistance value ratio between the first resistor 50 and the second resistor 52 is equal to or less than a voltage ratio obtained by dividing the first output lower limit voltage by a potential difference between the external power supply voltage (VCC) and the first output lower limit voltage, i.e., (first output lower limit voltage/(external power supply voltage−first output lower limit voltage)), then no source current flows in the current consumption adjusting circuit 90. In this manner, it is possible to prevent occurrence of source current in the entire physical quantity outputting circuit 300 even when the potential difference between the external power supply voltage (VCC) and the first output upper limit voltage is not equal to the potential difference between the first output lower limit voltage that is the lower limit value of the first output voltage (Vout1) and the reference voltage.

Here, the first output lower limit voltage is a specification value defined in a specification document or the like. If a range of the first output voltage (Vout1) is limited by a circuit configuration of a clamp circuit etc., the first output lower limit voltage may be a limited value set by the circuit configuration of the clamp voltage etc. The first output lower limit voltage may be in such a range by which linearity of the first output voltage (Vout1) can be obtained. The first output lower limit voltage may be a value obtained by deducting a value of 90%, 94%, or 97% of a power supply voltage from a power supply voltage. The power supply voltage may be an upper limit value of a power supply voltage applied to the power supply terminal 20 that is defined by a specification document or the like, or may be a voltage generated by a power supply 10.

While the present invention has been described with the embodiments, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, stages, etc. of each process performed by an apparatus, system, program, and method shown in the claims, specification, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or diagrams, it does not necessarily mean that the process must be performed in this order.

EXPLANATION OF REFERENCES

10: power supply;
20: power supply terminal;
22: first output terminal;
24: reference terminal;
26: second output terminal;
30: power supply voltage circuit;
32: EMC filter;
34: connection line;
36: connection line;
38: connection line;
40: first output amplifier;
42: second output amplifier;
50: first resistor;
52: second resistor;
54: auxiliary resistor;
56: third resistor;
58: fourth resistor;
60: internal circuit;
70: pull-down resistor;
72: pull-up resistor;
80: A/D converter;
90: current consumption adjusting circuit;
100: physical quantity outputting circuit;
110: engine controlling unit (ECU);
200: physical quantity outputting circuit;
300: physical quantity outputting circuit.

What is claimed is:

1. A physical quantity outputting circuit which outputs a first output voltage corresponding to a physical quantity sensing result, comprising:
a first output terminal which outputs the first output voltage;
a power supply terminal to which an external power supply voltage is input;
a reference terminal to which a reference voltage is input;
a power supply voltage circuit which generates an internal power supply voltage from the external power supply voltage;
a first output amplifier which is connected to the power supply voltage circuit and applied with the internal power supply voltage, which is connected to the reference terminal and applied with the reference voltage, to which a first input signal corresponding to the physical quantity sensing result is input and which outputs the first output voltage corresponding to the first input signal to the first output terminal;
a first resistor connected between the power supply terminal and the first output terminal; and
a second resistor connected between the first output terminal and the reference terminal, wherein
if the external power supply voltage is in a steady state, current that flows from the power supply voltage circuit to the first output amplifier has a constant value regardless of fluctuation of the first output voltage.

2. The physical quantity outputting circuit according to claim 1, wherein
if the external power supply voltage is in the steady state, current that flows from the first output amplifier to the second resistor is 0 A regardless of fluctuation of the first output voltage.

3. The physical quantity outputting circuit according to claim 1, wherein
a resistance value ratio obtained by dividing a resistance value of the first resistor by a resistance value of the second resistor is equal to or less than a voltage ratio obtained by dividing a potential difference between the external power supply voltage and a first output upper limit voltage that is an upper limit value of the first output voltage by the first output upper limit voltage, ((external power supply voltage–first output upper limit voltage)/first output upper limit voltage).

4. The physical quantity outputting circuit according to claim 3, wherein
the resistance value of the first resistor is 0.5 kΩ or more and 6.0 kΩ or less.

5. The physical quantity outputting circuit according to claim 3, wherein
the resistance value of the second resistor is 5 kΩ or more and 60 kΩ or less.

6. The physical quantity outputting circuit according to claim 3, comprising:
a current consumption adjusting circuit which draws a second current from the power supply terminal, wherein
the current consumption adjusting circuit draws the second current depending on fluctuation of a first current being current that flows in the first resistor, so that a sum of the first current and the second current stays constant.

7. The physical quantity outputting circuit according to claim 6, wherein the current consumption adjusting circuit has:
a second output terminal which outputs a second output voltage corresponding to the physical quantity sensing result;
a second output amplifier which is connected to the power supply voltage circuit and applied with the internal power supply voltage, which is connected to the reference terminal and applied with the reference voltage, to which a second input signal corresponding to the physical quantity sensing result is input and which outputs the second output voltage corresponding to the second input signal to the second output terminal;

a third resistor connected between the power supply terminal and the second output terminal; and a fourth resistor connected between the second output terminal and the reference terminal, wherein the second output amplifier outputs the second output voltage, so that a sum of the first output voltage and the second output voltage stays constant.

8. The physical quantity outputting circuit according to claim 7, wherein the resistance value of the first resistor and a resistance value of the third resistor are equal, and the resistance value of the second resistor and a resistance value of the fourth resistor are equal.

9. The physical quantity outputting circuit according to claim 8, wherein if a potential difference between the external power supply voltage and the first output upper limit voltage is greater than a potential difference between a first output lower limit voltage that is a lower limit value of the first output voltage and the reference voltage, the resistance value ratio is equal to or less than a voltage ratio obtained by dividing the first output lower limit voltage by a potential difference between the external power supply voltage and the first output lower limit voltage $$(\text{first output lower limit voltage}/(\text{external power supply voltage}-\text{first output lower limit voltage})).$$

10. The physical quantity outputting circuit according to claim 9, wherein the second output terminal is not connected to an external circuit.

11. The physical quantity outputting circuit according to claim 2, wherein a resistance value ratio obtained by dividing a resistance value of the first resistor by a resistance value of the second resistor is equal to or less than a voltage ratio obtained by dividing a potential difference between the external power supply voltage and a first output upper limit voltage that is an upper limit value of the first output voltage by the first output upper limit voltage $$((\text{external power supply voltage}-\text{first output upper limit voltage})/\text{first output upper limit voltage}).$$

\* \* \* \* \*